United States Patent

Lee

(10) Patent No.: US 9,209,903 B2
(45) Date of Patent: Dec. 8, 2015

(54) OPTICAL TRANSMITTER MODULE

(71) Applicant: Electronics and Telecommunications Research Institute, Daejeon (KR)

(72) Inventor: Jong Jin Lee, Gwangju (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/554,257

(22) Filed: Nov. 26, 2014

(65) Prior Publication Data

US 2015/0155944 A1 Jun. 4, 2015

(30) Foreign Application Priority Data

Nov. 29, 2013 (KR) .......................... 10-2013-0147168

(51) Int. Cl.
| | |
|---|---|
| *H01S 3/04* | (2006.01) |
| *H04B 10/50* | (2013.01) |
| *H01S 5/024* | (2006.01) |
| *H01S 5/02* | (2006.01) |

(52) U.S. Cl.
CPC ............ *H04B 10/503* (2013.01); *H01S 5/0215* (2013.01); *H01S 5/02415* (2013.01)

(58) Field of Classification Search
CPC ... H04B 10/503; H01S 3/0405; H01S 3/0674; H01S 5/0215; H01S 5/02208; H01S 5/02415
USPC ................................................ 372/34, 36, 90
See application file for complete search history.

(56) References Cited

U.S. PATENT DOCUMENTS

| | | | |
|---|---|---|---|
| 5,109,594 A | * | 5/1992 | Sharp et al. ...................... 29/600 |
| 7,092,418 B2 | | 8/2006 | Stewart et al. |
| 7,263,112 B2 | | 8/2007 | Oomori et al. |
| 2002/0070045 A1 | | 6/2002 | Musk et al. |
| 2006/0164817 A1 | * | 7/2006 | Yoshida ......................... 361/749 |
| 2006/0263013 A1 | | 11/2006 | Sone |
| 2013/0071126 A1 | * | 3/2013 | Lee et al. ...................... 398/135 |

FOREIGN PATENT DOCUMENTS

| | | |
|---|---|---|
| JP | 2007-207803 A | 8/2007 |
| KR | 10-0527845 | 11/2005 |
| KR | 10-0824922 B1 | 4/2008 |

* cited by examiner

*Primary Examiner* — Yuanda Zhang
(74) *Attorney, Agent, or Firm* — Nelson Mullins Riley & Scarborough LLP

(57) ABSTRACT

Provided is an optical transmitter module. The optical transmitter module includes a package including a lower substrate and a side substrate in which a through hole is formed, and a feed-through block coupled to the side substrate in which the through hole is formed. The feed-through block includes a feed-through substrate, at least one lead pin penetrating the feed-through substrate and coupled to the feed-through substrate, a base substrate formed to extend from the feed-through substrate in a direction in which the at least one lead pin is coupled, and a dielectric substrate formed between the at least one lead pin and the base substrate protruding from the feed-through substrate. Therefore, it is possible to improve the quality of a signal transmitted by the optical transmitter module.

10 Claims, 5 Drawing Sheets

OPTICAL TRANSMITTER MODULE

CLAIM FOR PRIORITY

This application claims priority to and the benefit of Korean Patent Application No. 10-2013-0147168 filed on Nov. 29, 2013 in the Korean Intellectual Property Office (KIPO), the entire contents of which are hereby incorporated by reference.

BACKGROUND

1. Technical Field

Example embodiments of the present invention relate in general to an optical transmitter module, and more particularly, to an optical transmitter module for minimizing impedance mismatch occurring therein.

2. Related Art

With the recent increase in data transmission through a communication network, such as the Internet, existing data transmission systems employing an electrical signal are required to have an increased transmission amount and transmission speed of data. Accordingly, use of optical communication systems capable of transmitting a large amount of data at high speed is increasing. Optical devices constituting such an optical communication system include an optical fiber that transfers a light signal, an optical transmitter module that generates and emits the light signal to the optical fiber, an optical receiver module that receives the light signal transferred through the optical fiber, an optical splitter that distributes or split the received light, and so on.

The optical transmitter module may include a thermoelectric cooler (TEC) to stabilize a wavelength. Such a TEC may stabilize a wavelength by controlling the temperature in the optical transmitter module. When a TEC is used, a laser diode (LD) and a reflecting mirror are positioned on the TEC. The LD is connected to a lead pin by wire bonding.

Methods of coupling the lead pin to a package may be classified into transistor outline (TO)-type feed-through and butterfly-type feed-through. In the case of the TO-type feed-through, when the height of the TEC increases, a mismatch section of the lead pin lengthens, and thus the quality of a signal transmitted by the optical transmitter module deteriorates.

In the case of the butterfly-type feed-through, unlike the TO-type feed-through, the mismatch section of the lead pin does not lengthen in proportion to the height of the TEC. However, for wire bonding with the LD, the lead pin is required to protrude from the package by a predetermined length. Therefore, there is a mismatch section whose length corresponds to the length of a portion of the lead pin protruding from the package, and the quality of a signal transmitted by the optical transmitter module deteriorates.

SUMMARY

Accordingly, example embodiments of the present invention are proposed to substantially obviate one or more problems of the related art as described above, and provide an optical transmitter module including a feed-through structure for minimizing a mismatch section of a lead pin.

Other purposes and advantages of the present invention can be understood through the following description, and will become more apparent by example embodiments of the present invention. Also, it is to be understood that purposes and advantages of the present invention can be easily achieved by means disclosed in claims and a combination of them.

In some example embodiments, an optical transmitter module includes: a package including a lower substrate and at least one side substrate extending upward from the lower substrate to form a sidewall, a through hole being formed in one of the at least one side substrate; and a feed-through block coupled to the side substrate in which the through hole is formed. The feed-through block includes: a feed-through substrate; at least one lead pin penetrating the feed-through substrate and coupled to the feed-through substrate; a base substrate formed to extend from the feed-through substrate in a direction in which the at least one lead pin is coupled; and a dielectric substrate formed between the at least one lead pin and the base substrate protruding from the feed-through substrate.

Here, the optical transmitter module may further include: a thermoelectric cooler (TEC) positioned on an upper surface of the lower substrate; a laser diode (LD) positioned on an upper surface of the TEC; and a reflecting mirror positioned on the upper surface of the TEC.

Here, the at least one lead pin may be coupled to the feed-through substrate by a medium of glass solder.

Here, when there are a plurality of lead pins, the lead pins may have identical intervals therebetween and may be coupled to the feed-through substrate in one direction.

Here, at least one transmission line connected to the lead pin may be formed on an upper surface of the dielectric substrate.

Here, the transmission line may be coupled to the LD by wire bonding.

Here, the feed-through substrate may be coupled to the side substrate in which the through hole is formed by a medium of an insulating material.

Here, the insulating material may be epoxy.

Here, the lead pin, the base substrate, and the dielectric substrate may be positioned in the through hole.

Here, the lower substrate may have a quadrangular shape, and the at least one side substrate may extend upward from respective sides of the lower substrate to form the sidewall.

BRIEF DESCRIPTION OF DRAWINGS

Example embodiments of the present invention will become more apparent by describing in detail example embodiments of the present invention with reference to the accompanying drawings, in which:

FIG. 1 is a cross-section view of an optical transmitter module formed by transistor outline (TO)-type feed-through;

FIG. 2 is a cross-section view of an optical transmitter module formed by butterfly-type feed-through;

DESCRIPTION OF EXAMPLE EMBODIMENTS OF THE PRESENT INVENTION

Figure 1:
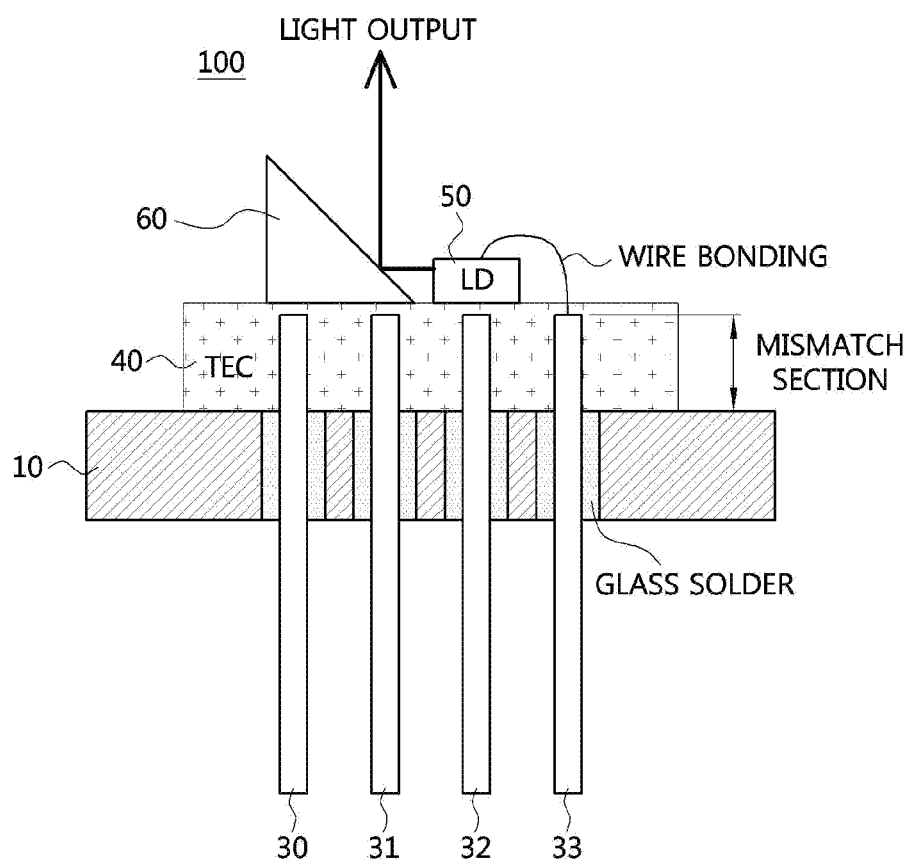

Example embodiments of the present invention are described below in sufficient detail to enable those of ordinary skill in the art to embody and practice the present invention. It is important to understand that the present invention may be embodied in many alternate forms and should not be construed as limited to the example embodiments set forth herein.

Accordingly, while the invention can be modified in various ways and take on various alternative forms, specific embodiments thereof are shown in the drawings and described in detail below as examples. There is no intent to limit the invention to the particular forms disclosed. On the contrary, the invention is to cover all modifications, equivalents, and alternatives falling within the spirit and scope of the appended claims.

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations of one or more referents.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

The terminology used herein to describe embodiments of the invention is not intended to limit the scope of the invention. The articles "a," "an," and "the" are singular in that they have a single referent, however the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, numbers, steps, operations, elements, parts and/or combinations thereof, but do not preclude the presence or addition of one or more other features, numbers, steps, operations, elements, parts, and/or combinations thereof.

Unless otherwise defined, all terms (including technical and scientific terms) used herein are to be interpreted as is customary in the art to which this invention belongs. It will be further understood that terms in common usage should also be interpreted as is customary in the relevant art and not in an idealized or overly formal sense unless expressly so defined herein.

Hereinafter, example embodiments of the present invention will be described in detail with reference to the accompanying drawings. To aid in understanding the present invention, like numbers refer to like elements throughout the description of the figures, and the description of the same component will not be reiterated.

FIG. 1 is a cross-section view of an optical transmitter module formed by transistor outline (TO)-type feed-through.

Referring to FIG. 1, an optical transmitter module 100 may include a lower substrate 10, a plurality of lead pins 30, 31, 32, and 33, a thermoelectric cooler (TEC) 40, a laser diode (LD) 50, and a reflecting mirror 60.

The lower substrate 10 is an element of the package of the optical transmitter module 100, and may generally have a quadrangular shape. The lower substrate 10 is not limited to the aforementioned shape, and may have various shapes, such as a circle, a triangle, and a pentagon. In the package, the TEC 40, the LD 50, the reflecting mirror 60, etc. may be positioned.

The plurality of lead pins 30 to 33 may be coupled to the lower substrate 10. Here, the plurality of lead pins 30 to 33 may penetrate the lower substrate 10 and may be coupled to the lower substrate 10 by the medium of glass solder. In other words, the plurality of lead pins 30 to 33 may be coupled to the lower substrate 10 through a high-temperature soldering process using the glass solder as a medium at a temperature of about 1000 degrees Celsius. The plurality of lead pins 30 to 33 may have identical intervals therebetween and may be coupled to the lower substrate 10 in one direction. Here, the glass solder may be a dielectric material.

For example, the plurality of lead pins 30 to 33 may penetrate the lower substrate 10 upward from below and may be coupled to the lower substrate 10 by the medium of the glass solder. Here, parts of the respective lead pins 30 to 33 coupled to the lower substrate 10 may protrude downward from the lower substrate 10, and other parts of the respective lead pins 30 to 33 may protrude upward from the lower substrate 10.

Meanwhile, the lengths of the lead pins 30 to 33 protruding upward from the lower substrate 10 may correspond to the height of the TEC 40 positioned on the lower substrate 10. Therefore, the greater the height of the TEC 40, the greater the lengths of the lead pins 30 to 33 protruding upward from the lower substrate 10 become.

According to the above-described TO-type feed-through (i.e., the coupling structure of the lead pins 30 to 33 and the lower substrate 10), electromagnetism is generated in the glass solder between the lead pins 30 to 33 and the lower substrate 10 upon signal transmission, and the coupling structure becomes a coaxial structure. At this time, an impedance of about 50 ohms ($\Omega$) occurs in general.

On the other hand, an impedance of 50 ohm or more occurs in the lead pins 30 to 33 protruding from the glass solder, and thus an impedance mismatch occurs. Such an impedance mismatch boosts reflection of a high-speed signal. Also, when the height of the TEC cooler 40 increases, portions of the lead pins 30 to 33 protruding from the glass solder is required to lengthen, and thus the impedance mismatch further increases.

Meanwhile, according to the TO-type feed-through, the case ground connection of the lower substrate 10 is used as the signal ground connection of the lead pins 30 to 33. In this case, severe external static electricity or noise may affect devices positioned in the package (e.g., the TEC 40, the LD 50, and the reflecting mirror 60). Therefore, in the case of a high-speed optical transmitter module operating at 10 GHz, it is required to separate the case ground connection of the package and the signal ground connection of the lead pins 30 to 33 so as to block external static electricity or noise.

The TEC 40 may be positioned on the upper surface of the lower substrate 10. The TEC 40 may function to stabilize a wavelength by controlling the temperature in the optical transmitter module 100.

The LD 50 may be positioned on the upper surface of the TEC 40. The LD 50 may be coupled to the plurality of lead pins 30 to 33 by wire bonding. The LD 50 may receive a signal from the plurality of lead pins 30 to 33 and send a transmission signal toward the reflecting mirror 60 based on the received signal.

The reflecting mirror 60 may be positioned on the upper surface of the TEC 40, and may be positioned side by side with the LD 50. In other words, the reflecting mirror 60 may be positioned on the upper surface of the TEC 40 to face a signal sending portion of the LD 50. The reflecting mirror 60 may reflect the signal sent from the LD 50.

Figure 2:
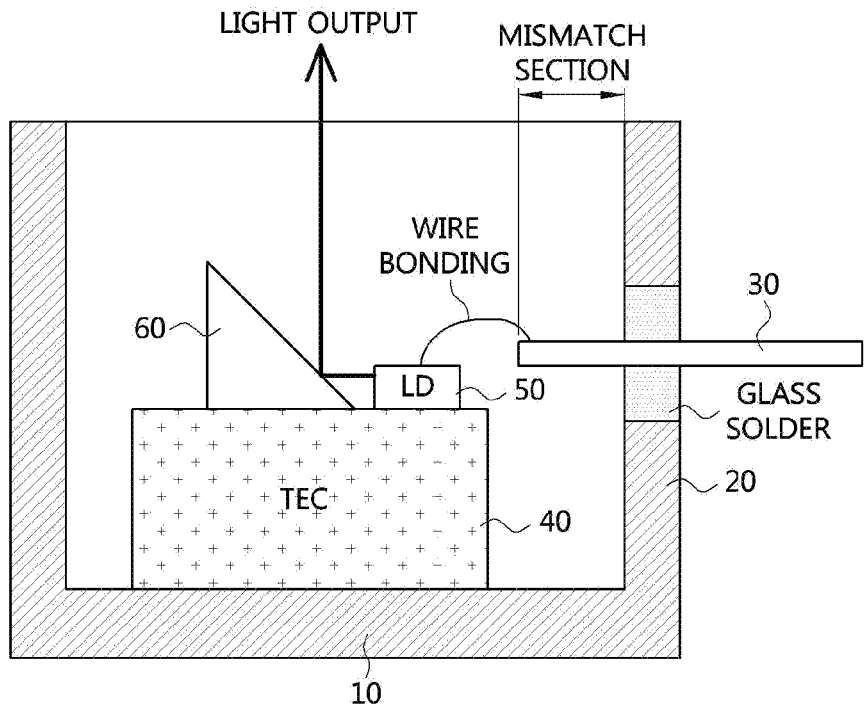

FIG. 2 is a cross-section view of an optical transmitter module formed by butterfly-type feed-through.

Referring to FIG. 2, an optical transmitter module 200 may include a lower substrate 10, a side substrate 20, at least one lead pin 30, a TEC 40, an LD 50, and a reflecting mirror 60.

The lower substrate 10 is an element of the package of the optical transmitter module 200, and may generally have a quadrangular shape. The lower substrate 10 is not limited to the aforementioned shape, and may have various shapes, such as a circle, a triangle, and a pentagon. In the package, the TEC 40, the LD 50, the reflecting mirror 60, etc. may be positioned.

The side substrate 20 is another element of the package, and may extend upward from the lower substrate 10 to form a sidewall. For example, when the lower substrate 10 is a quadrangle, the side substrate 20 may extend upward from respective sides of the lower substrate 10 to form a sidewall. In the package, the TEC 40, the LD 50, the reflecting mirror 60, etc. may be positioned.

The at least one lead pin 30 may be coupled to the side substrate 20. Here, the at least one lead pin 30 may penetrate the side substrate 20 and may be coupled to the side substrate 20 by the medium of glass solder. In other words, the at least one lead pin 30 may be coupled to the side substrate 20 through a high-temperature soldering process using the glass solder as a medium at a temperature of about 1000 degrees Celsius. The at least one lead pin 30 may have identical intervals therebetween and may be coupled to the side substrate 20 in one direction. Here, the glass solder may be a dielectric material.

For example, the at least one lead pin 30 may penetrate the side substrate 20 in a horizontal direction (e.g., a direction parallel with the lower substrate 10) and may be coupled to the side substrate 20 by the medium of the glass solder.

Here, a position at which the at least one lead pin 30 is coupled to the side substrate 20 may be determined regardless of the height of the TEC 40, but the at least one lead pin 30 is required to protrude from the side substrate 20 for wire bonding connection with the LD 50. Therefore, a portion of the lead pin 30 coupled to the side substrate 20 may protrude from the side substrate 20.

According to the above-described butterfly-type feed-through (i.e., the coupling structure of the lead pin 30 and the side substrate 20), electromagnetism is generated in the glass solder between the lead pin 30 and the side substrate 20 upon signal transmission, and the coupling structure becomes a coaxial structure. At this time, an impedance of about 50 ohms occurs in general.

On the other hand, an impedance of 50 ohm or more occurs in the portion of the lead pin 30 protruding from the glass solder, and thus an impedance mismatch occurs. Such an impedance mismatch boosts reflection of a high-speed signal.

The TEC 40 may be positioned on the upper surface of the lower substrate 10. The TEC 40 may stabilize a wavelength by controlling the temperature in the optical transmitter module 200.

The LD 50 may be positioned on the upper surface of the TEC 40. The LD 50 may be coupled to the at least one lead pin 30 by wire bonding. The LD 50 may receive a signal from the at least one lead pin 30 and send a transmission signal toward the reflecting mirror 60 based on the received signal.

The reflecting mirror 60 may be positioned on the upper surface of the TEC 40, and may be positioned side by side with the LD 50. In other words, the reflecting mirror 60 may be positioned on the upper surface of the TEC 40 to face a signal sending portion of the LD 50. The reflecting mirror 60 may reflect the signal sent from the LD 50.

Figure 3:
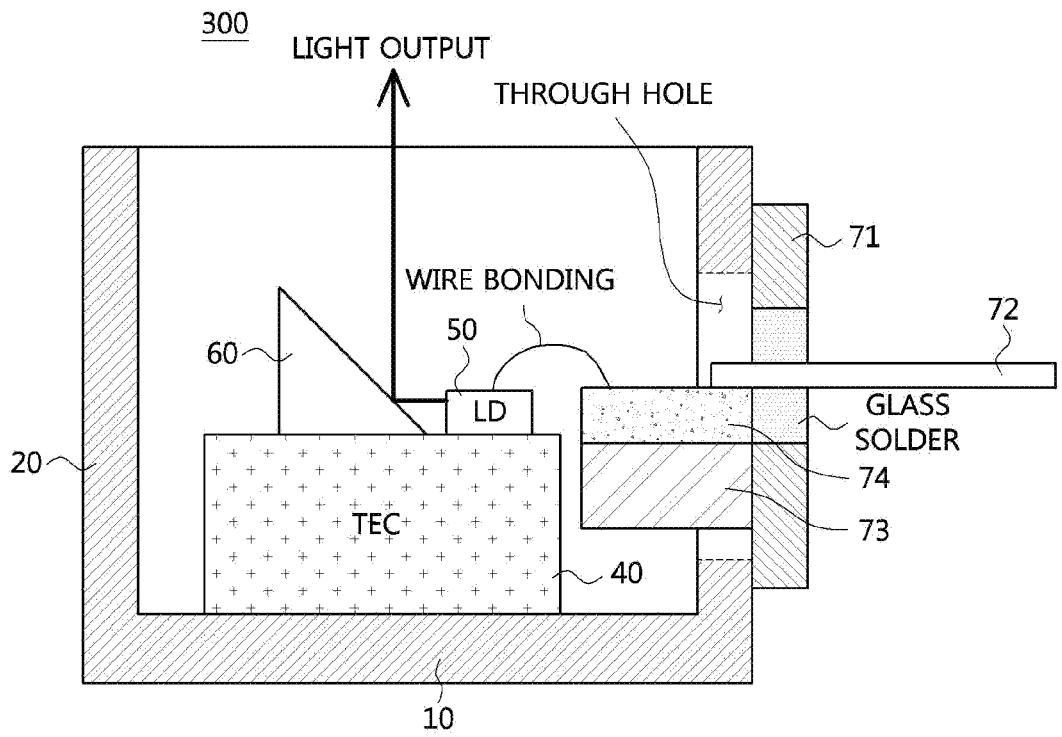
FIG. 3 is a cross-section view of an optical transmitter module according to an example embodiment of the present invention.
Figure 4:
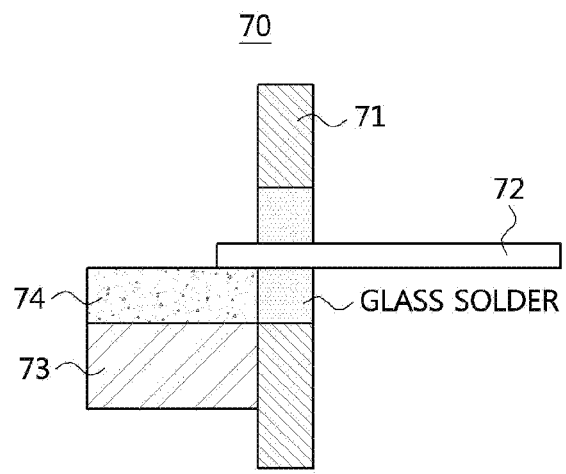
FIG. 4 is a cross-section view of a feed-through block according to an example embodiment of the present invention.
Figure 5:
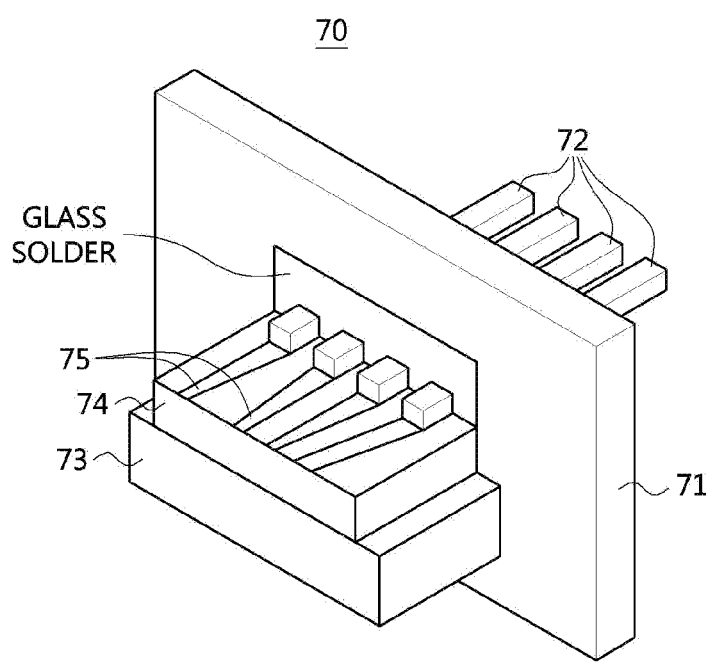
FIG. 5 is a perspective view of the feed-through block according to an example embodiment of the present invention.
Figure 6:
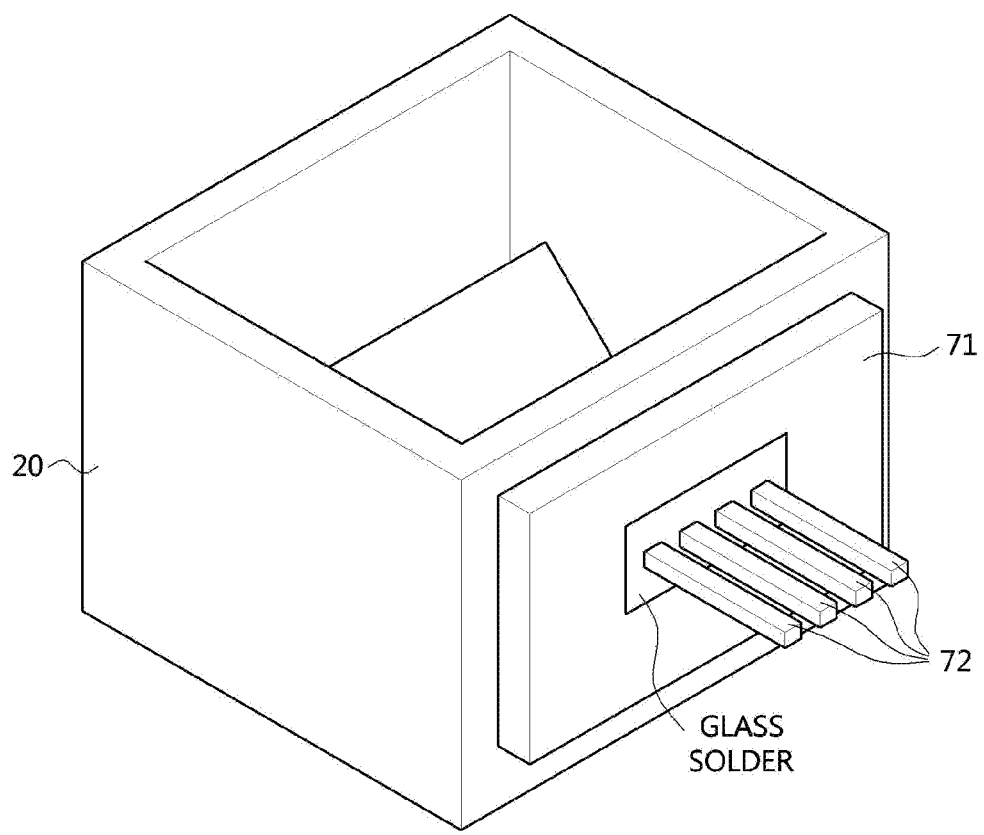
FIG. 6 is a perspective view of an optical transmitter module according to an example embodiment of the present invention.

FIG. 3 is a cross-section view of an optical transmitter module according to an example embodiment of the present invention. FIG. 4 is a cross-section view of a feed-through block according to an example embodiment of the present invention, and FIG. 5 is a perspective view of the feed-through block according to an example embodiment of the present invention. FIG. 6 is a perspective view of an optical transmitter module according to an example embodiment of the present invention.

Referring to FIGS. 3 to 6, an optical transmitter module 300 may include a package including a lower substrate 10 and at least one side substrate 20, and a feed-through block 70 coupled to the side substrate 20. Also, the optical transmitter module 300 may further include a TEC 40, an LD 50, and a reflecting mirror 60 positioned in the package.

The lower substrate 10 is an element of the package of the optical transmitter module 300, and may generally have a quadrangular shape. The lower substrate 10 is not limited to the aforementioned shape, and may have various shapes, such as a circle, a triangle, and a pentagon.

The at least one side substrate 20 is another element of the package, and may extend upward from the lower substrate 10 to form a sidewall. For example, when the lower substrate 10 is a quadrangle, there are four side substrates 20, and the respective side substrates 20 may extend upward from respective sides of the lower substrate 10 to form a sidewall. In one of the at least one side substrate 20, a through hole may be formed.

The feed-through block 70 may be coupled to the side substrate 20 in which the through hole is formed. The feed-through block 70 may include a feed-through substrate 71, at least one lead pin 72, a base substrate 73, and a dielectric substrate 74. Like the at least one side substrate 20, the feed-through substrate 71 may have a long shape in an up-down direction.

The at least one lead pin 72 may be coupled to the feed-through substrate 71. Here, the at least one lead pin 72 may penetrate the feed-through substrate 71 and may be coupled to the feed-through substrate 71 by the medium of glass solder. In other words, the at least one lead pin 72 may be coupled to the feed-through substrate 71 through a high-temperature soldering process using the glass solder as a medium at a temperature of about 1000 degrees Celsius. The at least one lead pin 72 may have identical intervals therebetween and may be coupled to the feed-through substrate 71 in one direction. Here, the glass solder may be a dielectric material.

For example, the at least one lead pin 72 may penetrate the feed-through substrate 71 in a horizontal direction (e.g., a direction parallel with the lower substrate 10) and may be coupled to the feed-through substrate 71 by the medium of the glass solder. Here, a portion of the at least one lead pin 72 may protrude from the feed-through substrate 71.

The base substrate 73 may be formed to extend from the feed-through substrate 71 in a direction in which the at least one lead pin 72 is coupled. The base substrate 73 may be formed under the at least one lead pin 72 coupled to the feed-through substrate 71. Also, the horizontal length of the base substrate 73 (i.e., the length in the direction in which the lead pin 72 is coupled to the feed-through substrate 71) may be formed to be longer than the length of the portion of the lead pin 72 protruding from the feed-through substrate 71.

The dielectric substrate 74 may be formed between the lead pin 72 protruding from the feed-through substrate 71 and the base substrate 73. The horizontal length of the dielectric substrate 74 (i.e., the length in the direction in which the lead pin 72 is coupled to the feed-through substrate 71) may be identical to the length of the horizontal length of the base substrate 73. In other words, the horizontal length of the dielectric substrate 74 (i.e., the length in the direction in which the lead pin 72 is coupled to the feed-through substrate 71) may be formed to be longer than the length of the portion of the lead pin 72 protruding from the feed-through substrate 71. The upper surface of the dielectric substrate 74 may be in contact with the lead pin 72 protruding from the feed-through substrate 71, and the lower surface of the dielectric substrate 74 may be in contact with the base substrate 73.

On the upper surface of the dielectric substrate 74, a transmission line 75 connected to the lead pin 72 may be formed. The transmission line 75 may be formed in the direction in which the lead pin 72 is coupled to the feed-through substrate 71. The number of transmission lines 75 formed on the dielectric substrate 74 may be identical to the number of lead pins 72 coupled to the feed-through substrate 71. For example, when the number of lead pins 72 coupled to the feed-through substrate 71 is four, four transmission lines 75 may be formed on the dielectric substrate 74. Also, an electrode of the transmission line 75 may be patterned through a thin film process. Therefore, the transmission line 75 may be formed to be diverse in width and position.

Meanwhile, the transmission line 75 may be connected to the LD 50 by wire bonding. Due to such a connection structure, a signal transmitted from the lead pin 72 may be transmitted to the LD 50 through the transmission line 75. Therefore, while the signal is transmitted through the transmission line 75 formed on the dielectric substrate 74 after passed through the glass solder, a uniform impedance (e.g., 50 ohms) may be maintained.

When the feed-through block 70 is coupled to the side substrate 20 in which the through hole is formed, the lead pin 72, the base substrate 73, and the dielectric substrate 74 protruding from the feed-through substrate 71 may be positioned in the through hole.

The TEC 40 may be positioned on the upper surface of the lower substrate 10. The TEC 40 may stabilize a wavelength by controlling the temperature in the optical transmitter module 300.

The LD 50 may be positioned on the upper surface of the TEC 40. The LD 50 may be coupled to the transmission line 75 by wire bonding. The LD 50 may receive a signal from the transmission line 75 and send a transmission signal toward the reflecting mirror 60 based on the received signal.

The reflecting mirror 60 may be positioned on the upper surface of the TEC 40, and may be positioned side by side with the LD 50. In other words, the reflecting mirror 60 may be positioned on the upper surface of the TEC 40 to face a signal sending portion of the LD 50. The reflecting mirror 60 may reflect the signal sent from the LD 50.

Figure 7:
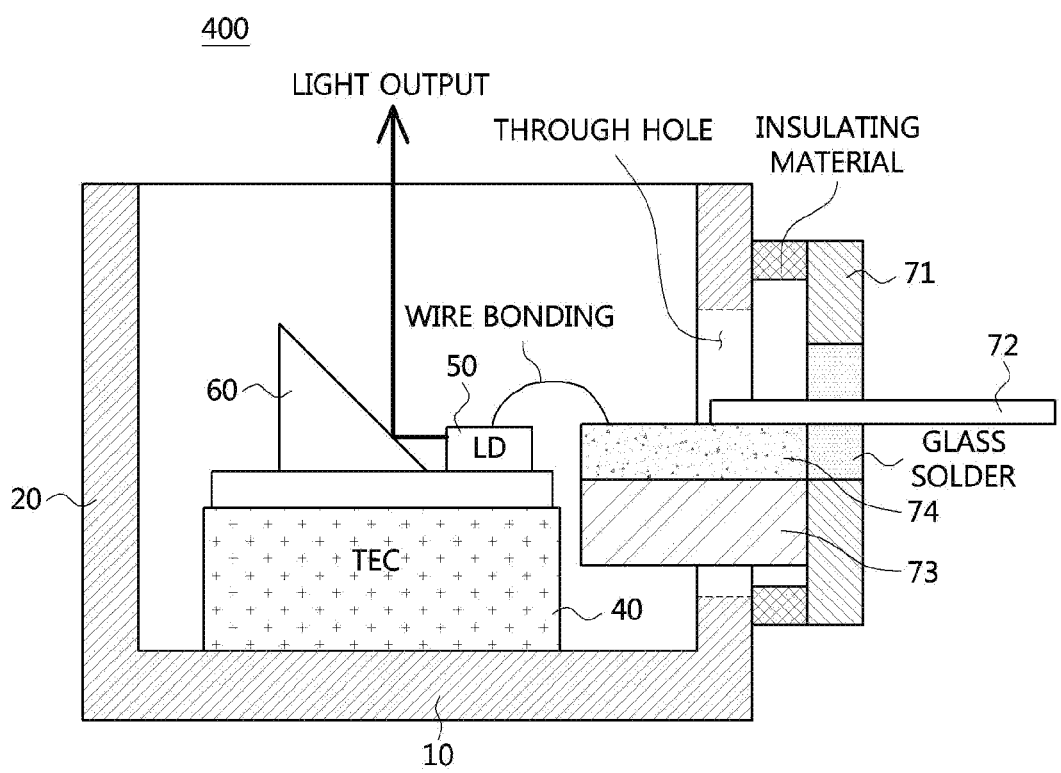
FIG. 7 is a cross-section view of an optical transmitter module according to another example embodiment of the present invention.

FIG. 7 is a cross-section view of an optical transmitter module according to another example embodiment of the present invention.

Referring to FIG. 7, an optical transmitter module 400 may include a package, a feed-through block, a TEC 40, an LD 50, and a reflecting mirror 60.

The package may include a lower substrate 10 and a side substrate 20. The side substrate 20 may extend upward from the lower substrate 10 to form a sidewall. Also, a through hole may be formed in the side substrate 20. Here, the detailed structure of the package may be the same as described with reference to FIGS. 3 to 6.

The feed-through block may be coupled to the side substrate 20 in which the through hall is formed. At this time, the feed-through block may be coupled to the side substrate 20 in which the through hall is formed by the medium of an insulating material. Here, the insulating material may be epoxy or so on.

The feed-through block may include a feed-through substrate 71, at least one lead pin 72 penetrating the feed-through substrate 71 and coupled to the feed-through substrate 71, a base substrate 73 formed to extend from the feed-through substrate 71 in a direction in which the at least one lead pin 72 is coupled, and a dielectric substrate 74 formed between the at least one lead pin 72 and the base substrate 73 protruding from the feed-through substrate 71. Here, the detailed structure of the feed-through block may be the same as described with reference to FIGS. 3 to 6.

According to an example embodiment of the present invention, it is possible to minimize a mismatch section of a lead pin, and thus the quality of a signal transmitted by an optical transmitter module can be improved.

In addition, it is possible to minimize the influence of external static electricity or noise exerted on devices positioned in the optical transmitter module.

While the example embodiments of the present invention and their advantages have been described in detail, it should be understood that various changes, substitutions and alterations may be made herein without departing from the scope of the invention.

What is claimed is:

1. An optical transmitter module, comprising:
   a package including a lower substrate and at least one side substrate extending upward from the lower substrate to form a sidewall, a through hole being formed in one of the at least one side substrate; and
   a feed-through block coupled to the side substrate in which the through hole is formed,
   wherein the feed-through block comprises:
   a feed-through substrate;
   at least one lead pin penetrating the feed-through substrate and coupled to the feed-through substrate;
   a base substrate formed to extend from the feed-through substrate in a direction in which the at least one lead pin is coupled;
   a dielectric substrate formed between the at least one lead pin and the base substrate protruding from the feed-through substrate, and
   wherein a horizontal length of the base substrate is longer than the length portion of the at least one lead pin protruding from the feed-through substrate.

2. The optical transmitter module of claim 1, further comprising:
   a thermoelectric cooler (TEC) positioned on an upper surface of the lower substrate;
   a laser diode (LD) positioned on an upper surface of the TEC; and a reflecting mirror positioned on the upper surface of the TEC.

3. The optical transmitter module of claim 1, wherein the at least one lead pin is coupled to the feed-through substrate by a medium of glass solder.

4. The optical transmitter module of claim 1, wherein, when there are a plurality of lead pins, the lead pins have identical intervals therebetween and are coupled to the feed-through substrate in one direction.

5. The optical transmitter module of claim 1, wherein at least one transmission line connected to the at least one lead pin is formed on an upper surface of the dielectric substrate.

6. The optical transmitter module of claim 5, wherein the transmission line is coupled to the LD by wire bonding.

7. The optical transmitter module of claim 1, wherein the feed-through substrate is coupled to the side substrate in which the through hole is formed by a medium of an insulating material.

8. The optical transmitter module of claim 7, wherein the insulating material is epoxy.

9. The optical transmitter module of claim 1, wherein the lead pin, the base substrate, and the dielectric substrate are positioned in the through hole.

10. The optical transmitter module of claim 1, wherein the lower substrate has a quadrangular shape, and the at least one side substrate extends upward from respective sides of the lower substrate to form the sidewall.

\* \* \* \* \*